US006869308B2

(12) United States Patent
Wu

(10) Patent No.: US 6,869,308 B2
(45) Date of Patent: Mar. 22, 2005

(54) CABLE CONNECTOR HAVING CROSS-TALK SUPPRESSING FEATURE AND METHOD FOR MAKING THE CONNECTOR

(75) Inventor: Jerry Wu, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 183 days.

(21) Appl. No.: 10/317,876

(22) Filed: Dec. 11, 2002

(65) Prior Publication Data

US 2004/0115988 A1 Jun. 17, 2004

(51) Int. Cl.[7] .................... H03R 12/24
(52) U.S. Cl. .................... 439/497
(58) Field of Search .................... 439/497, 95, 327, 439/352, 579

(56) References Cited

U.S. PATENT DOCUMENTS 5,928,029 A * 7/1999 Lam .................... 439/497
6,024,597 A * 2/2000 Lok .................... 439/497
6,380,485 B1 * 4/2002 Beaman et al. .......... 174/88 R
6,705,893 B1 * 3/2004 Ko .................... 439/607

* cited by examiner

*Primary Examiner*—Phuong Dinh
(74) *Attorney, Agent, or Firm*—Wei Te Chung

(57) ABSTRACT

A high speed cable connector (1) includes a cover (3), a base (80) and a cable assembly (30) mounted between the cover and the base. The cable assembly includes a cable (42) consisting of a plurality of lines (44). Each line has a pair of upper and lower signal wires (442, 444) and a grounding wire (446). Front ends of the lines are sandwiched between upper half (462) and lower half (464) of a spacer (46) to which upper and lower shielding plates (50, 52) are respectively mounted. The upper and lower shielding plates are electrically connected with each other. The upper and lower signal wires are soldered to signal circuitry on top and bottom faces of a printed circuit board (62), respectively. The upper and lower shielding plates have engaging arms (508) soldered to ground circuitry of on the top and bottom faces of the printed circuit board, respectively. Each grounding wire is soldered to a corresponding upper shielding plate. Each pair of upper and lower signal wires is located between two pairs of upper and lower shielding plates, whereby cross-talk between the signal wires of two neighboring lines can be effectively suppressed.

5 Claims, 8 Drawing Sheets

CABLE CONNECTOR HAVING CROSS-TALK SUPPRESSING FEATURE AND METHOD FOR MAKING THE CONNECTOR

CROSS-REFERENCE TO RELATED APPLICATIONS

This application is a co-pending application of U.S. patent application Ser. No. 10/112,922, entitled "ELECTRICAL CONNECTOR HAVING A LATCH MECHANISM", invented by Jerry Wu and filed on Aug. 10, 2002, and U.S. patent application Ser. No. 10/264,650, entitled "CABLE CONNECTOR HAVING IMPROVED CROSS-TALK SUPRESSING FEATURE", invented by JERRY WU, YIN-TSE KAO, AN-JEN YANG, YUAN-CHIEH LIN and JIM ZHAO and filed on Oct. 3, 2002. Both the co-pending applications are assigned to the same assignee of this application. The disclosure of the co-pending U.S. patent application Ser. No. 10/112,922 is wholly incorporated herein by reference.

BACKGROUND OF THE INVENTION

1. Field of the Invention

The present invention relates to a cable connector, and particularly to a high speed cable connector for use in InfiniBand™ application.

2. Description of Related Art

Following the popularity of the Internet, information access speed becomes an important issue. Although the information processing speed of a central process unit (CPU) of a data processing machine, i.e., a computer or a server, is increased enormously, information processing speed of I/O port devices of the machine is still relatively low, which results in that information still can not be accessed by the machine from the Internet with a speed as quickly as expected.

To solve this problem, an InfiniBand™ I/O port structure is proposed, which offers three levels of link performance —2.5 Gbits, 10 Gbits and 30 Gbits/sec. An electrical connector for use in such high speed application always confronts a problem of cross-talk. Cross-talk means interference of signals of neighboring signal lines.

U.S. Pat. No. 6,394,839 B2 (the '839 patent) disclosed a high speed cable connector which has two lines 12_a_, 12_b_ each include a signal pair 20 and a ground conductor 18. The ground conductors 18 are connected to a shorting bar 50 which has a first portion 52 located between the signal pairs to improve the problem of cross-talk therebetween.

The structure disclosed by the '839 patent still cannot overcome the problem of cross-talk occurred in an electrical connector for InfiniBand™ architecture since it must transmit and process information and data at an even higher speed.

U.S. Patent Application Publication No. US 2002/0081874 A1 (the '874 publication) disclosed a cable connector having ground contacts 26 separating pairs of signal lines 36_a_, 36_b_ whereby cross-talk between adjacent pairs of signal lines can be suppressed. However, in the '874 publication to connect the signal lines 36_a_, 36_b_ with corresponding signal contacts 38_a_, 38_b_ together is very laborious. Furthermore, it is unreliable regarding the electrical connection between the ground lines 38 and the ground contacts 26 since they are not directly connected together but via an arrangement member 16.

Thus, an improved shielding structure which can be easily assembled and effectively reduce cross-talk between signal pairs of a cable connector for InfiniBand™ application is required.

SUMMARY OF THE INVENTION

Accordingly, an object of the present invention is to provide a high speed cable connector wherein cross-talk between neighboring signal pairs at an end of a cable connecting with the connector can be effectively reduced and suppressed.

A further object of the present invention is to provide a high speed cable connector wherein grounding wires of a cable of the connector can be readily and reliably connected to shielding plates and signal lines can be easily electrically connected with signal contacts of the cable connector.

In order to achieve the objects set forth, a high speed cable connector for InfiniBand™ application includes a cover and a base both made by die casting of aluminum alloy, and a cable assembly mounted between the cover and the base. The cable assembly includes a cable consisting of a plurality of lines. Each line has a pair of signal wires and a grounding wire. The signal wires are soldered to signal circuitry on top and bottom faces of a rear end of a printed circuit bard. A spacer consisting of upper and lower halves is mounted to the rear end of the printed circuit board. The spacer defines a plurality of elliptical passageways therein. The lines of the cable extend through the elliptical passageways. A plurality of pairs of upper and lower shielding plates is secured to the upper and lower halves of the spacer, respectively. Each shielding plate has a forwardly extending arm soldered to grounding circuitry on the top or bottom face of the rear end of the printed circuit board. The pair of signal wires is located between two neighboring pairs of shielding plates, whereby noise interference between two neighboring lines of the cable at the ends soldered to the printed circuit board can be effectively reduced. The grounding wire of each of the lines is soldered to a corresponding upper shielding plate which is electrically connected with the lower shielding plate of the same pair of upper and lower shielding plates. The printed circuit board has a front end fixed to a rear end of an insulative body which has a forwardly extending tongue. Contacts are received in top and bottom faces of the tongue. The contacts are used for electrically engaging with a complementary connector. The contacts each have a rear end soldering to the front end of the printed circuit board. A pair of latches is mounted on lateral sides of the base near a front end thereof. The latches are used for latching with the complementary connector when it mates with the cable connector in accordance with the present invention. The cable connector further comprises a pull tab movably mounted therein. When the pull tab is pulled rearwards, driving blocks formed on the pull tab push the latches laterally outwardly to causes the lathes to release their latching from the complementary connector.

Other objects, advantages and novel features of the invention will become more apparent from the following detailed description when taken in conjunction with the accompanying drawings.

DETAILED DESCRIPTION OF THE INVENTION

Figure 1:
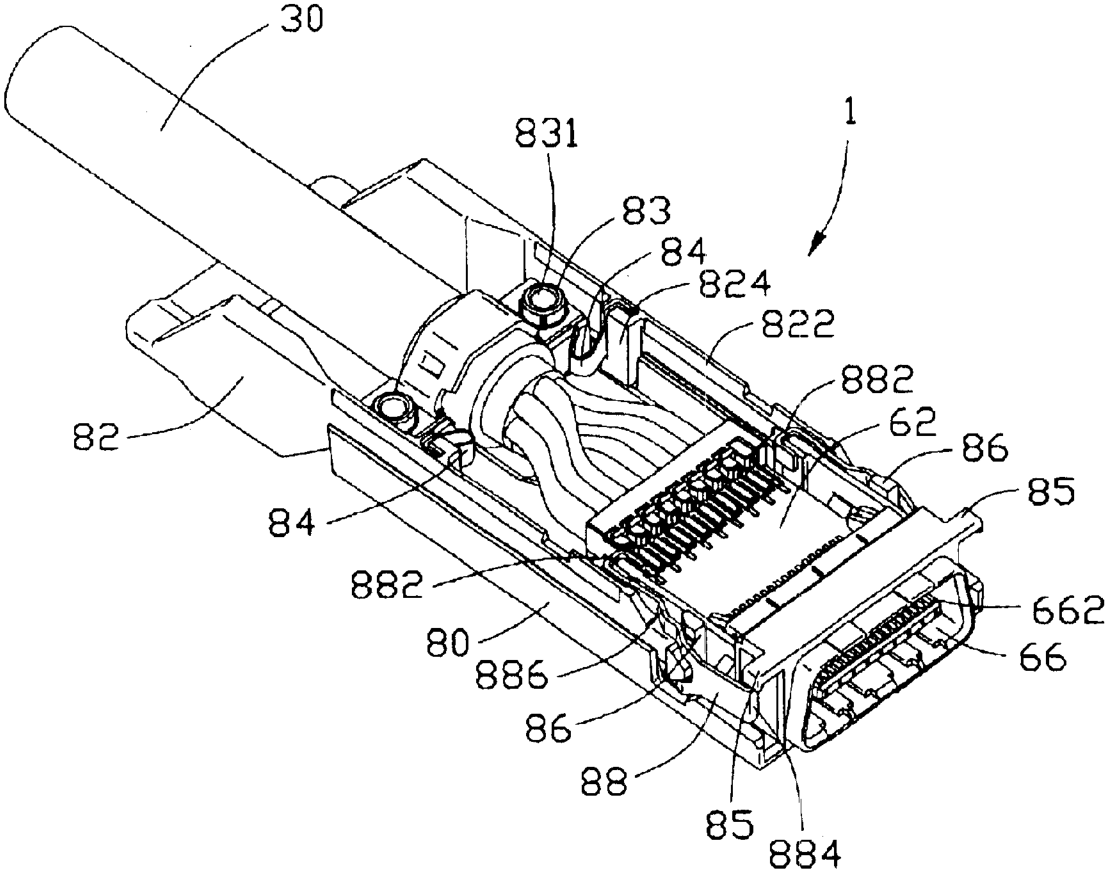
FIG. 1 is a perspective view of a cable connector for use in an InfiniBand™ application in accordance with the present invention.

Reference will now be made to the drawing figures to describe the present invention in detail.

Figure 2:
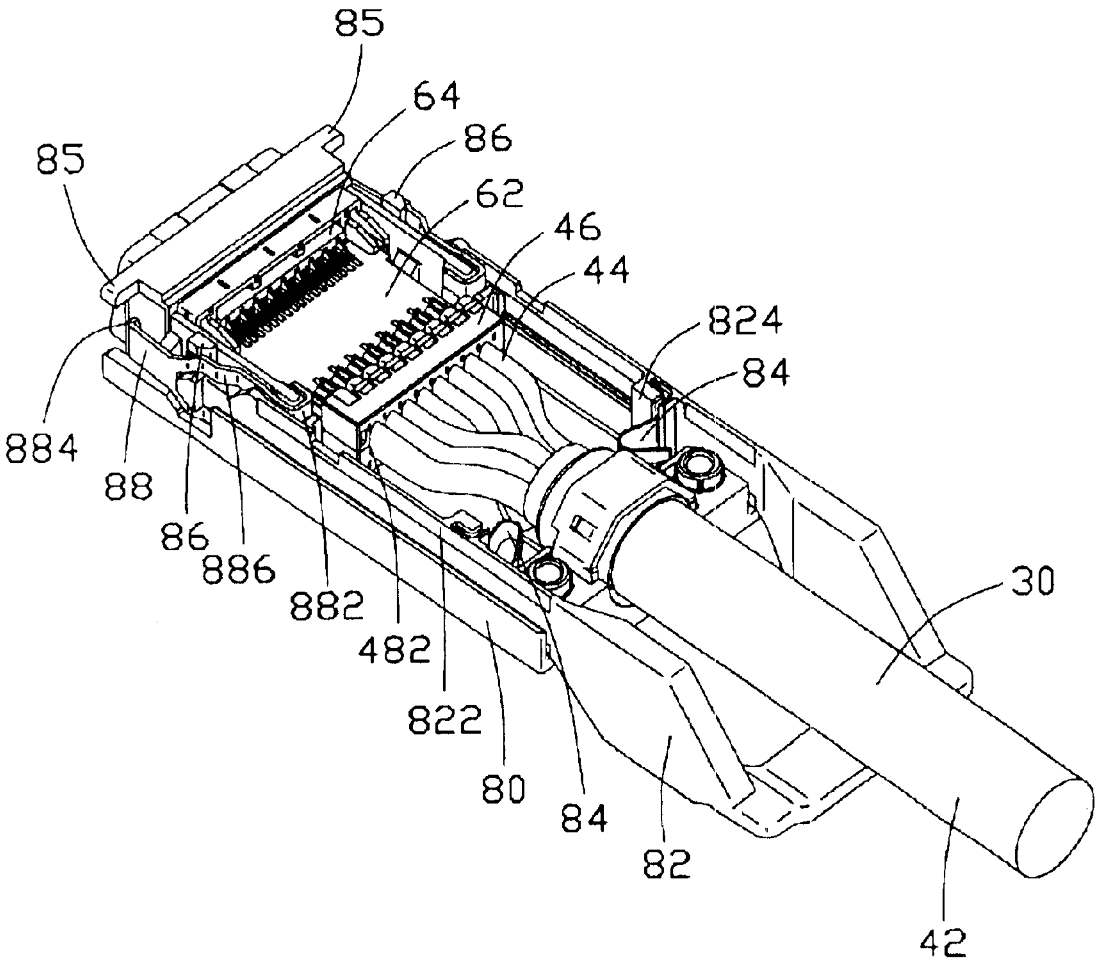
FIG. 2 is a view similar to FIG. 1 but from a different aspect.
Figure 3:
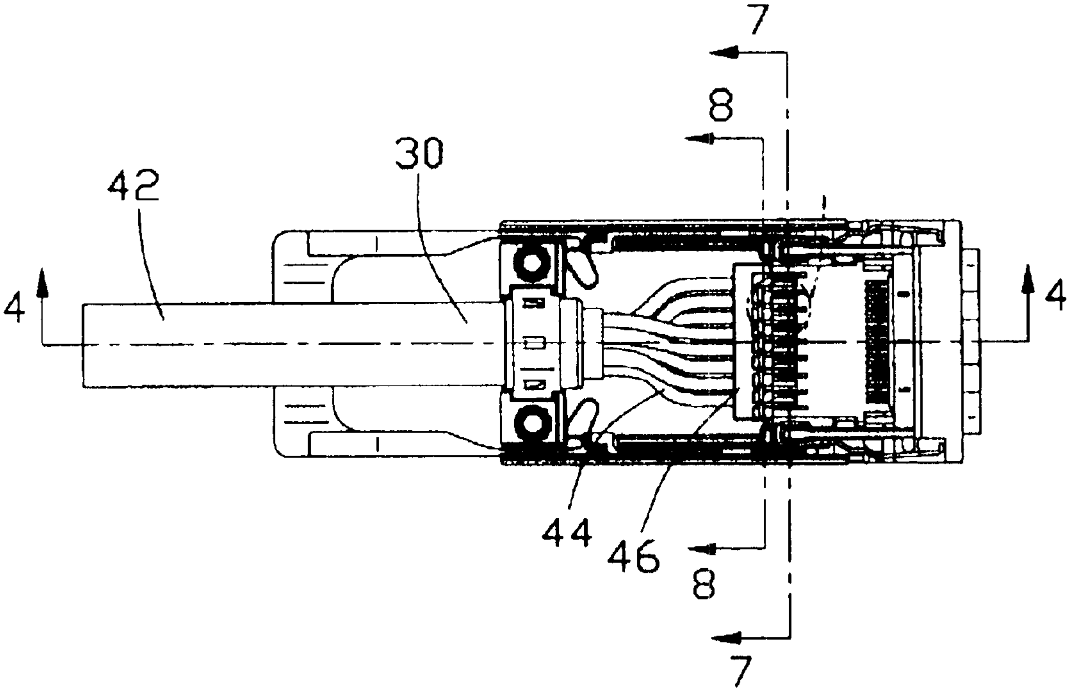
FIG. 3 is a top plan view of FIG. 1.
Figure 4:
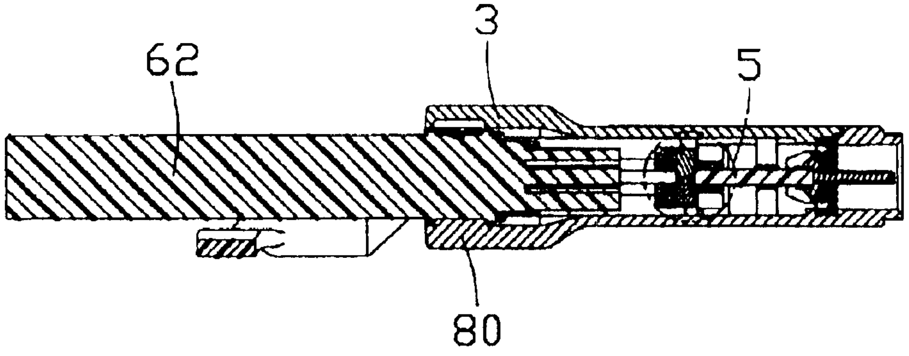
FIG. 4 is a cross-sectional view taken along line 4—4 of FIG. 3 with a cover mounted thereon.
Figure 7:
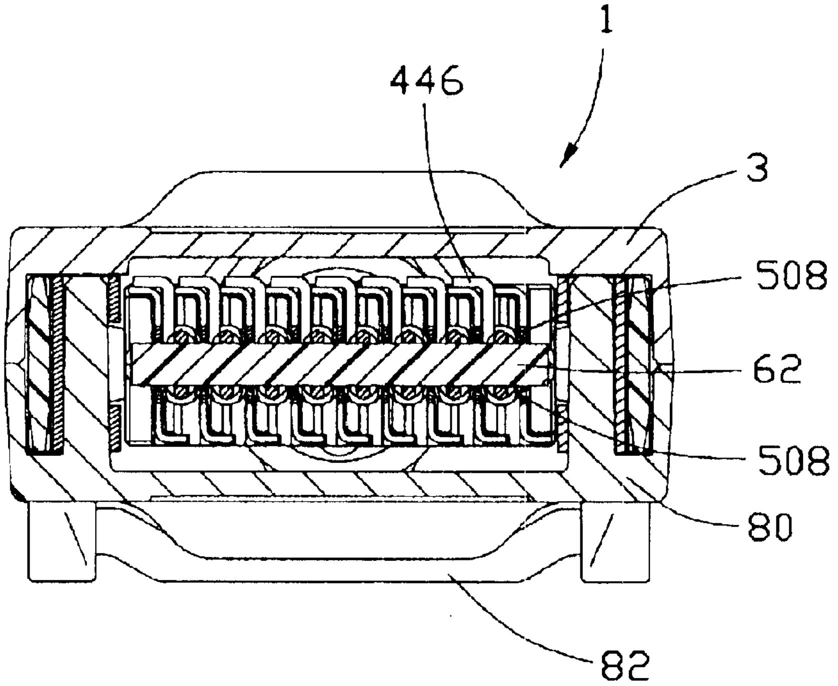
FIG. 7 is an enlarged cross-sectional view taken along line 7—7 of FIG. 3 with the cover mounted thereon.
Figure 8:
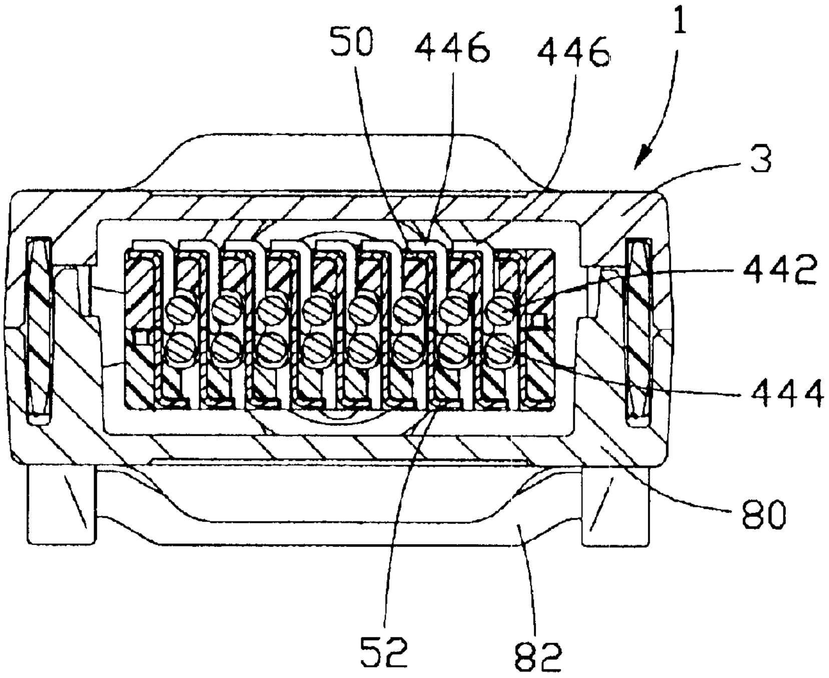
FIG. 8 is an enlarged cross-sectional view taken along line 8—8 of FIG. 3 with the cover mounted thereon.

Referring to FIGS. 1 and 2, a cable connector 1 for use in an InfiniBand™ application in accordance the present invention comprises a cover 3 (FIGS. 4, 7 and 8), a cable assembly 30 and a base 80. Both the cover 3 and base 80 are formed by die casting of metal such as aluminum alloy. The cover 3 is provided with screws (not shown) for screwing into screw holes 831 defined in studs 83 formed in the base 80 after the cable assembly 30 is put in the base 80 to thereby assemble the cover 3, the cable assembly 30 and the base 80 together. To mount the cover 3 to the base 80, firstly protrusions (not shown) formed on a front end of the cover 3 are positioned below side flanges 85 formed on a front end of the base 80, respectively. Then a rear end of the cover 3 on which the screws are located is pivoted downwardly about the flanges 85 toward the base 80 until the rear end of the cover 3 is in contact with a rear end of the base 80. The cable connector 1 is further provided with a pull tab 82 movably mounted between the cover 3 and base 80 for releasing a latch between the cable connector 1 and a complementary connector. Regarding this detailed illustrations are given below.

Figure 9:
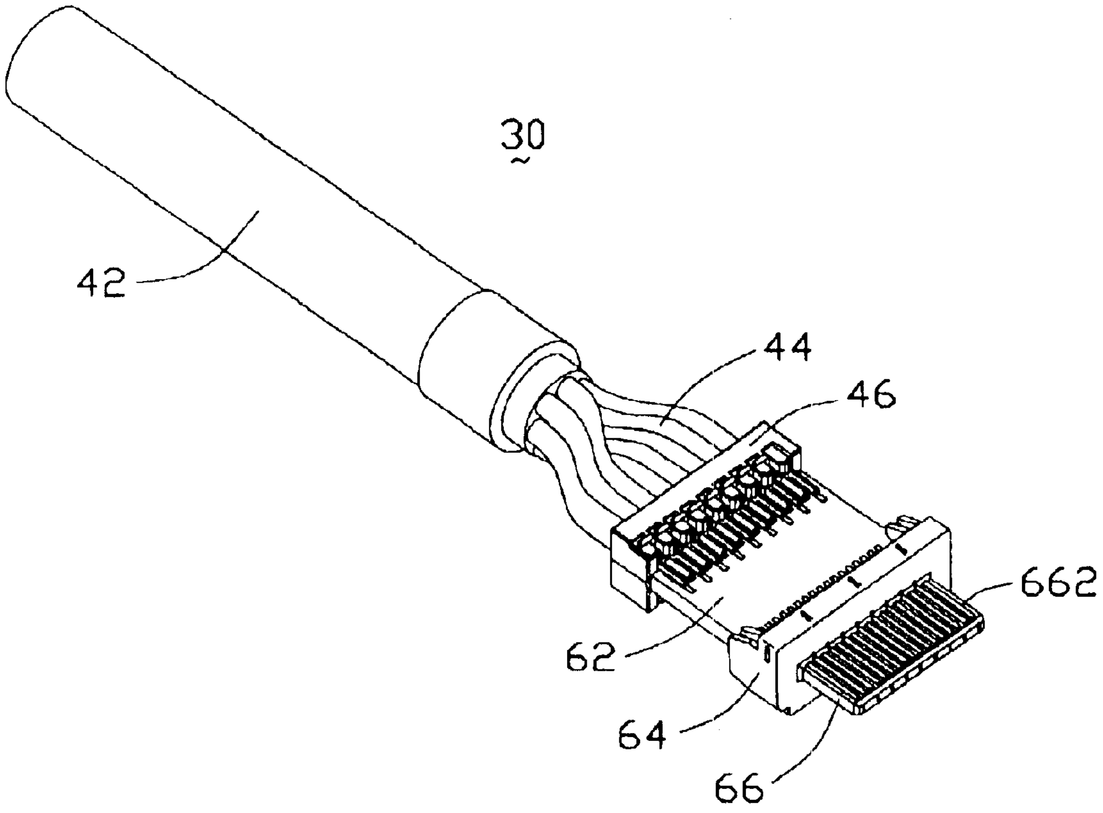
FIG. 9 is a perspective view of a cable assembly of the cable connector of FIG. 1.
Figure 10:
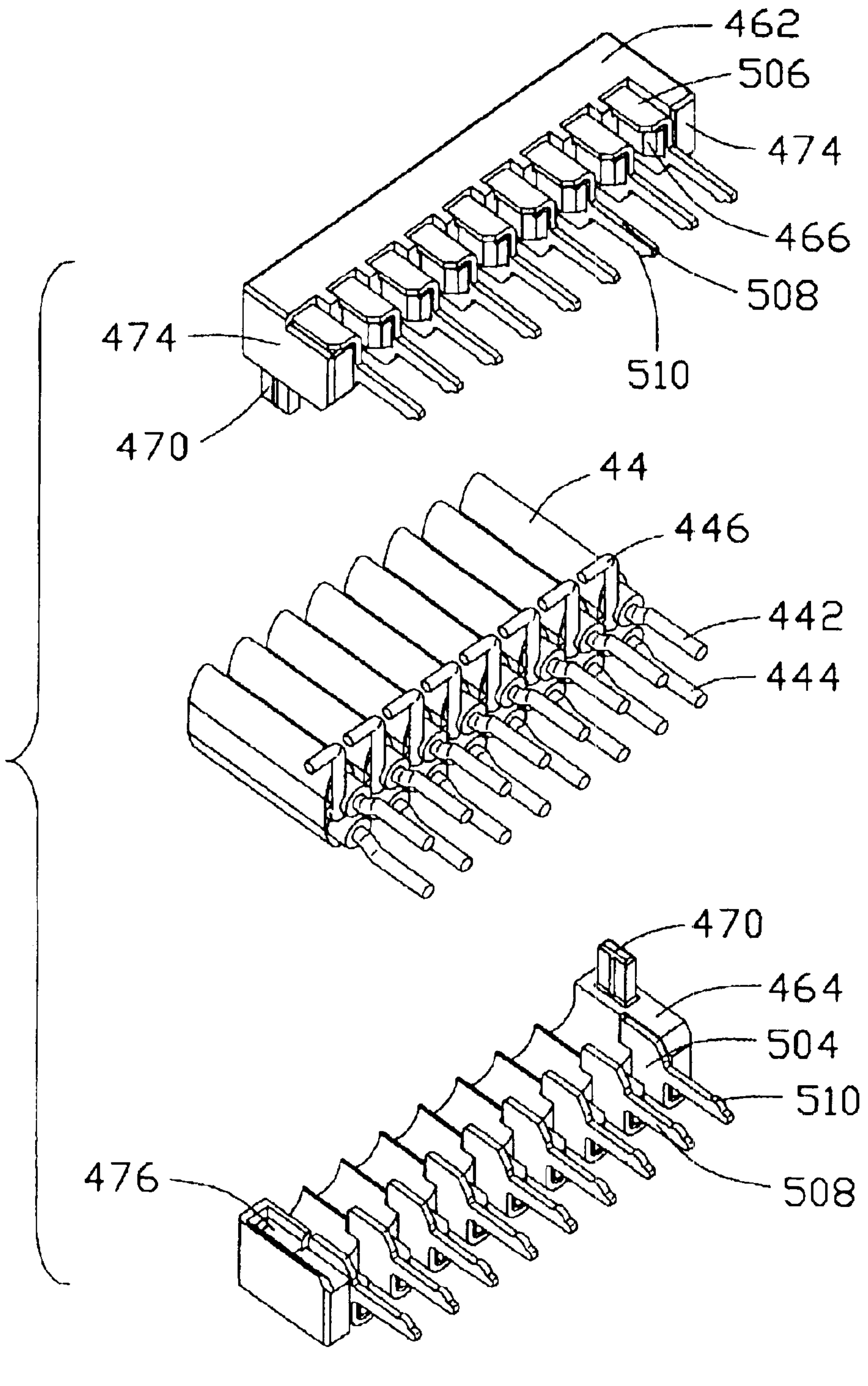
FIG. 10 is an enlarged exploded view of a cable front end and upper and lower halves of a spacer with upper and lower shielding plates mounted thereon, respectively.
Figure 11:
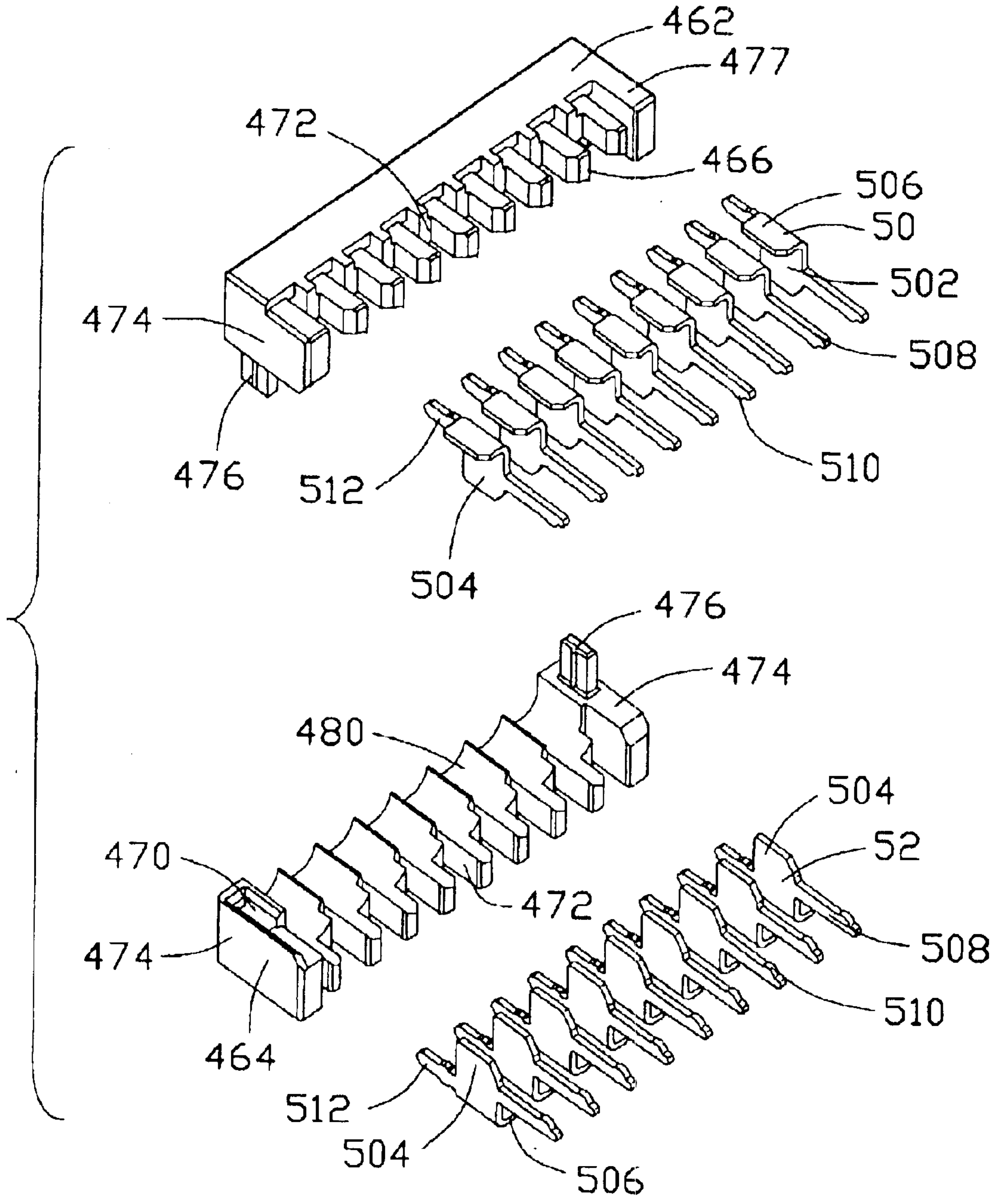
FIG. 11 is an enlarged exploded view of the upper and lower halves of the spacer and the upper and lower shielding plates.

Also referring to FIGS. 9, 10 and 11, the cable assembly 30 includes a cable 42 accommodating eight lines 44 therein, a spacer 46 fixedly connecting front ends of the eight lines 44 in an equally spaced relationship, nine upper shielding plates 50, nine lower shielding plates 52, a printed circuit board (PCB) 62, an insulative body 64 having a rear end to which a front end of the PCB 62 is secured and a tongue 66 extending forwardly. The front ends of the lines 44 extend in the spacer 46. A plurality of contacts 662 is received in top and bottom faces (not labeled) of the tongue 66 for electrically connecting with the complementary connector. Each contact 662 has a rear end soldering to the front end of the PCB 62. The spacer 46 has a cuboidal configuration and consists of an upper half 462 and a lower half 464.

Each of the upper and lower halves 462, 464 of the spacer 46 has a generally U-shaped configuration. Eight partitions 466 are formed between two lateral sidewalls 474 of the half 462 (464), whereby eight passageways 472 are defined in the half 462 (464). A rectangular recess (not shown) is defined in a bottom face of one of the sidewalls 474 of the upper half 462 and a rectangular post 476 is formed on a bottom face of the other one of the sidewalls 474 of the upper half 462. A rectangular recess 470 is defined in a top face of one of the sidewalls 474 of the lower half 464 and a rectangular post 476 is formed on a top face of the other one of the sidewalls 474 of the lower half 464. The upper and lower halves 462, 464 are assembled together to form the spacer 46 by inserting the post 476 of the upper half 462 into the recess 470 in the lower half 464 and the post 476 of the lower half 464 into the recess in the upper half 462. Particularly referring to FIGS. 2 and 11, the lower half 464 defines eight grooves 480 in a top face thereof, and, correspondingly, the upper half 462 defines eight grooves (not shown) in a bottom face thereof. When the upper and lower halves 462, 464 are assembled together, these grooves cooperatively forms passageways 482 for the spacer 46, wherein each passageway 482 has an elliptical profile. Front ends of the lines 44 of the cable 42 are respectively fitted in the elliptical passageways 482. Since the passageways 482 each have an elliptical profile, when the front ends of the lines 44 are received in the passageways 484 they can be more securely located in position.

Particularly referring to FIGS. 10 and 11, each of the upper and lower shielding plates 50, 52 is configured to have an L-shaped body 502 with a vertical flap 504 and a horizontal flap 506. An engaging arm 508 extends forwardly from the vertical flap 504 with a protrusion 510 at a free end thereof. A mounting arm 512, which has barbs (not labeled) thereon, extends rearwards from the vertical flap 504. The upper shielding plates 50 are assembled to the upper half 462 by interferentially inserting the mounting arms 512 into the upper half 462 with the horizontal flaps 506 positioned on top faces (not labeled) of the partitions 466, respectively, wherein the protrusions 510 of the engaging arms 508 are directed downwards. The lower shielding plates 50 are assembled to the lower half 464 by interferentially inserting the mounting arms 512 into the lower half 464 with the horizontal flaps 506 positioned on bottom faces of the partitions 466, respectively, wherein the protrusions 510 of the engaging arms 508 are directed upwardly.

Still referring to FIG. 10, each line 44 of the cable 42 has a differential pair of signal wires 442, 444 and a grounding wire 446.

Referring to FIGS. 3–9, in assembling the cable connector 1 in accordance with the present invention, the front end of the PCB 62 is soldered to the rear ends of the contacts 662. The signal wires 442, 444 are soldered to signal circuitry (not labeled) on top and bottom faces of the rear end the PCB 62, respectively. The upper half 462 together with the upper shielding plates 50 and the lower half 464 together with the lower shielding plates 52 are assembled to the rear end of the PCB 62 by inserting the posts 470 into the recesses 476 so that the rear end of PCB 62 is sandwiched between the engaging arms 508 of the upper and lower shielding plates 50, 52. The protrusions 510 are soldered to grounding circuitry (not labeled) on the top and bottom faces of the rear end of the PCB 62, respectively. Finally, the grounding wires 446 are soldered to the horizontal flaps 506 of the upper shielding plates 50, respectively, whereby the cable assembly 30 as shown in FIG. 9 is completed.

Particularly referring to FIGS. 5–9, after the completion of the cable assembly 30, the upper and lower shielding plates 50, 52 are electrically connected together so that grounding circuitry on the bottom face of the PCB 62 is also electrically connected with the grounding wires 446 which are soldered to the upper shielding plates 50. Furthermore, the front ends of the upper and lower signal wires 442, 444 of neighboring lines 44 soldered to the PCB 62 are separated by the engaging arms 508 of the upper and lower shielding plates 50, 52 between the two neighboring lines 44. Accordingly, cross-talk between the two neighboring lines 44 at the ends soldered to the PCB 62 can be effectively suppressed by the engaging arms 508 of the upper and lower shielding plates 50, 52.

Figure 5:
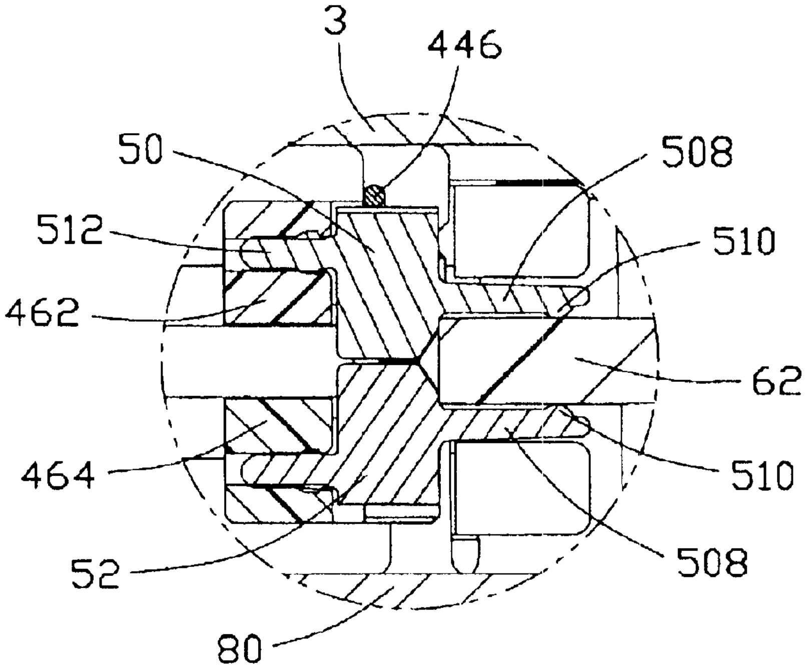
FIG. 5 is an enlarged view of a circled portion of FIG. 4 indicated by reference number 5 thereof.
Figure 6:
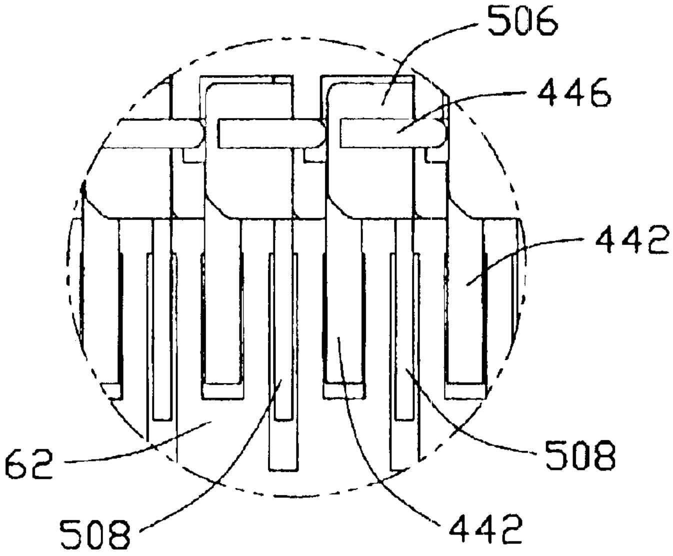
FIG. 6 is an enlarged view of a circled portion of FIG. 3 indicated by reference number 6 thereof.

Referring to FIGS. 1, 2, the pull tab 82 has two arms 822 extending forwardly, each arm 822 forming a mounting block 824 at an inner side of a rear portion thereof and a driving block 86 at the inner side of a front end thereof. A pair of latches 88 is mounted on a front portion of lateral walls of the base 80. Each latch 88 has a hooked front end 884 for latching with the complementary connector when the cable connector 1 in accordance with the present invention mates with the complementary connector, a rear end 882 fixedly secured to the base 80, and a cam portion 886 formed between the hooked front end 884 and the rear end 882. The cam portion 886 has an inner face abutting against the driving block 86 of a corresponding arm 822 of the pull tab 82. The cam portion 886 has an inwardly, rearwards stepped configuration, whereby when the driving block 86 moves rearwards as the pull tab 82 is pulled rearwards, the driving block 86 causes the cam portion 886 and thus the hooked front end 884 to move laterally outwardly, thereby to release the latch between the cable connector 1 in accordance with the present invention and the complementary connector. A pair of leaf springs 84 is provided with the cable connector 1 wherein each spring 84 has a front end fixed in the mounting block 824 of a corresponding arm 822 of the pull tab 82, and a rear end fixed to the base 80. When the pull tab 82 is pulled rearwards, the springs 84 are compressed. When the pulling force is released, the springs 84 return to their original configurations, thereby motivating the pull tab 82 to return to is original position prior to being pulled. Thus, the latches 80 return to their original position as shown in FIG. 5. Concerning more detailed information of the structure, mounting and action of the pull tab 82, the leaf springs 84 and the latches 88, one can refer to the disclosure of the co-pending patent application, i.e., U.S. patent application Ser. No. 10/112,922, mentioned in the CROSS-REFERENCE TO RELATED APPLICATIONS.

The cable assembly 30, pull tab 82, latches 88 and springs 84 are mounted to the base 80 in a manner as shown in FIGS. 1 and 2. Thereafter, the cover 3 is mounted to the base 80 in a manner as disclosed before thereby to complete the assembly of the cable connector 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cable connector comprising:

a metal shell;

an insulative body received in the metal shell;

a plurality of contacts secured to the insulative body;

a printed circuit board electrically connecting with the contacts;

an insulative spacer mounted in the metal shell;

a plurality of pairs of upper and lower shielding plates fixed to the spacer, the upper and lower shielding plates respectively electrically connecting with grounding circuitry on top and bottom faces of the printed circuit board, respectively; and a cable having a plurality of lines having front ends fixed to the spacer, each line having a pair of upper and lower signal wires and a grounding wire, the grounding wire being electrically connected to a corresponding shielding plate, the upper and lower signal wires being respectively electrically connected to signal circuitry on the top and bottom faces of the printed circuit board, respectively; wherein the upper and lower signal wires of each line are located between two pairs of upper and lower shielding plates so that interference between two neighboring lines can be effectively suppressed; wherein the spacer consists of upper half and lower half connected with each other, the upper shielding plates being mounted to the upper half, the lower shielding plates being mounted to the lower half; wherein each of the upper and lower shielding plates has a body, an engaging arm extending from the body and electrically connecting with the printed circuit board and a mounting arm extending from the body and having an interferential fit with a corresponding one of the upper and lower halves; wherein the body has a generally L-shaped configuration whit a vertical flap from which the engaging and mounting arms extend, and a horizontal flap for electrically connecting with a corresponding grounding wire; wherein the upper and lower shielding plates are electrically connected together; wherein the spacer has elliptical passageways and the lines are respectively fitted in the elliptical passageways.

2. The cable connector in accordance with claim 1 further comprising a pull tab slideably mounted in the shell, a latch mounted in the shell and drivably connected with the pull tab, the latch being adapted to latch with a complementary connector when the cable connector and the complementary connector are connected together, when the pull tab is pulled, the latch being activated by the pull tab in a manner adapted to unlatch from the complementary connector.

3. The cable connector in accordance with claim 2 further comprising a spring mounted in the shell, the spring being compressed when the pull tab is pulled.

4. A cable assembly for a cable connector comprising:

an insulative body forming a tongue extending forwardly;

a plurality of contacts received in top and bottom face of the tongue, adapted for electrically connecting with a complementary connector;

a printed circuit board having a front end electrically connecting with rear ends of the contacts;

a cable having a plurality of lines each having a pair of signal wires electrically connecting with signal circuitry on a rear end of the printed circuit board and a grounding wire;

a spacer mounted to the rear end of the printed circuit board, defining a plurality of passageways therein, said lines extending through the passageways, respectively; and a plurality of shielding plates secured to the spacer and electrically connecting with grounding circuitry on the rear end of the printed circuit board, wherein the grounding wire of each line is electrically connected to a corresponding shielding plate and the signal wires of each line are located between two neighboring shielding plates, whereby cross-talk between two neighboring lines can be effectively suppressed; wherein the passageways in the spacer each have an elliptical profile; wherein the spacer consists of an upper half and a lower half, and the shielding plates comprises upper shielding plates secured to the upper half and lower shielding plates secured to the lower halt each shielding plate having a forwardly extending engaging arm soldered to the printed circuit board; wherein the upper half forms a post and a recess in a bottom face thereof, and the lower half forms a post and a recess in a top face thereof, the post of the upper half being inserted into the recess of the lower half and the post of the lower half being inserted into the recess of the upper half; wherein the grounding wire is soldered to a corresponding upper shielding; wherein the pair of signal wires includes an upper signal wire soldered to a top face of the printed circuit board and a lower signal wire soldered to a bottom face of the printed circuit board, the upper shielding plates being soldered to the top face of the printed circuit board and the lower shielding plates being soldered to the bottom face of the printed circuit board, the upper signal wire being located between two neighboring upper shielding plates, and the lower signal wire being located between two neighboring lower shielding plates.

5. A cable connector assembly comprising:

a housing with a plurality of contacts electrically connected to an internal printed circuit board;

a cable including plural differential pairs of wires, each differential pair of said wires including two signal wires extending in a forward direction respectively soldered on two opposite sides of a rear region of the printed circuit board, and a drain wire exposed to an exterior by peeling before said signal wires are exposed by peeling, and extending in a direction perpendicular to said forward direction; and a spacer defining channels receiving the differential pairs of wires, respectively; two rows of shielding plates associated with said spacer and including portions extending toward the printed circuit board and located on said two sides of the rear region of the printed circuit board to isolate the exposed corresponding adjacent signal wires; wherein at least one of said two rows of shielding plates are mechanically and electrically contacted with the corresponding drain wires, respectively; wherein said spacer includes two halves, and said two rows of shielding plates are respectively mounted to the corresponding halves; wherein said differential pairs of wires are tightly sandwiched between said two halves, and thus said spacer functions as a strain relief for prevent impact derived from the cable from imposing upon joints between the signal wires and the printed circuit board.

* * * * *